United States Patent
Sze et al.

(10) Patent No.: US 9,846,193 B2
(45) Date of Patent: Dec. 19, 2017

(54) SEMICONDUCTOR PACKAGE TESTING APPARATUS

(71) Applicant: ASM Technology Singapore Pte Ltd, Singapore (SG)

(72) Inventors: Chak Tong Sze, Kwai Chung (HK); Pei Wei Tsai, Kwai Chung (HK); Cho Hin Cheuk, Kwai Chung (HK); Si Ming Chan, Kwai Chung (HK); Kam Sing Lee, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 42 days.

(21) Appl. No.: 14/710,747

(22) Filed: May 13, 2015

(65) Prior Publication Data

US 2015/0331012 A1   Nov. 19, 2015

Related U.S. Application Data

(60) Provisional application No. 61/993,097, filed on May 14, 2014, provisional application No. 62/082,698, filed on Nov. 21, 2014.

(51) Int. Cl.
*G01R 1/04* (2006.01)
*G01R 31/28* (2006.01)

(52) U.S. Cl.
CPC ....... *G01R 31/2896* (2013.01); *G01R 1/0425* (2013.01); *G01R 1/0466* (2013.01)

(58) Field of Classification Search
CPC . G01R 31/2896; G01R 1/0425; G01R 1/0466
USPC ................................... 324/756.01–757.05
See application file for complete search history.

(56) References Cited

U.S. PATENT DOCUMENTS

| | | | | |
|---|---|---|---|---|
| 5,374,888 | A * | 12/1994 | Karasawa | G01R 1/07314 324/754.03 |
| 5,500,604 | A * | 3/1996 | Swarbrick | G01R 1/0735 324/756.04 |
| 6,204,675 | B1 * | 3/2001 | Moewes | G01R 31/2891 324/756.02 |
| 6,404,181 | B1 * | 6/2002 | Hikita | H05K 13/021 324/756.05 |
| 7,250,780 | B2 * | 7/2007 | Hembree | G01R 31/2886 324/756.02 |
| 7,977,961 | B2 * | 7/2011 | Koizumi | G01R 31/2863 324/756.01 |

(Continued)

*Primary Examiner* — Melissa Koval
*Assistant Examiner* — Rahul Maini
(74) *Attorney, Agent, or Firm* — Ostrolenk Faber LLP

(57) ABSTRACT

A semiconductor package testing apparatus comprises a package holder for holding a semiconductor package and which is positionable together with the semiconductor package at a test contactor station. There are probe pins located at the test contactor station for contacting a bottom surface of the semiconductor package and which are configured to apply an upwards force on the semiconductor package during testing of the semiconductor package. A restraining mechanism that is movable from a first position remote from the package holder and a second position over the package holder is configured to restrict lifting of the semiconductor package by the probe pins during testing of the semiconductor package when the restraining mechanism is at its second position.

18 Claims, 6 Drawing Sheets

(56) References Cited

U.S. PATENT DOCUMENTS

| | | | |
|---|---|---|---|
| 2001/0000295 A1* | 4/2001 | Farnworth | G01R 1/0466 324/756.02 |
| 2006/0208753 A1* | 9/2006 | Tosi | G01R 31/311 324/756.02 |
| 2014/0167800 A1* | 6/2014 | Fuergut | G01R 31/2601 324/756.01 |

* cited by examiner

SEMICONDUCTOR PACKAGE TESTING APPARATUS

FIELD OF THE INVENTION

The invention relates to the testing of semiconductor packages, and in particular to testing apparatus for testing various characteristics of the semiconductor packages.

BACKGROUND AND PRIOR ART

In semiconductor package testing, a test contactor for testing various characteristics of the semiconductor package commonly uses spring loaded probe pins to provide an electrical interface between the tester channels of the test contactor and external leads of the semiconductor package. A semiconductor package to be tested is placed on an insulated package holder, and vacuum suction force is used to hold the package in place. The semiconductor package is then transferred to a test station where it is contacted by spring-loaded probe pins and tests relating to various characteristics of the semiconductor package are performed.

Conventionally, mechanical systems are used to provide external forces to physically hold the semiconductor package before contact by the probe pins, since the vacuum suction force is generally inadequate to overcome the contact force introduced by the spring-loaded probe pins to provide a stable contact for electrical tests.

In some situations, it may not be preferred for the semiconductor package that is being tested to be mechanically held, so as to avoid light emitted from the semiconductor package from being blocked by the mechanical system. When conducting optical tests, it may be necessary for all five sides of a semiconductor package, including its top surface and its four sides to emit light. In such circumstances, one prior art approach is to reduce the spring forces exerted by the probe pins so that a vacuum suction force is sufficient to secure the semiconductor package during electrical and optical tests on it. However, reducing the spring forces may lead to less reliability when conducting electrical tests.

It would thus be beneficial to provide an apparatus that is suitable for conducting both optical and electrical tests with higher reliability as compared to the prior art.

SUMMARY OF THE INVENTION

It is thus an object of the invention to seek to provide a restraining mechanism to restrict movement of a semiconductor package when conducting different types of tests on the semiconductor package to overcome at least some of the shortcomings of testing apparatus in the prior art.

According to a first aspect of the invention, there is provided a semiconductor package testing apparatus comprising: a package holder for holding a semiconductor package and which is positionable together with the semiconductor package at a test contactor station; probe pins located at the test contactor station for contacting a bottom surface of the semiconductor package and which are configured to apply an upwards force on the semiconductor package during testing of the semiconductor package; and a restraining mechanism that is movable from a first position remote from the package holder and a second position over the package holder, the restraining mechanism at the second position being configured to restrict lifting of the semiconductor package by the probe pins during testing of the semiconductor package.

According to a second aspect of the invention, there is provided a method for testing a semiconductor package, comprising the steps of: positioning a package holder holding the semiconductor package at a test contactor station; contacting a bottom surface of the semiconductor package with probe pins located at the test contactor station and applying an upwards force on the semiconductor package with the probe pins during testing of the semiconductor package; and moving a restraining mechanism from a first position remote from the semiconductor package and a second position over the semiconductor package, wherein the restraining mechanism restricts lifting of the semiconductor package by the probe pins at its second position.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of a semiconductor package testing apparatus in accordance with the invention will now be described with reference to the accompanying drawings, in which.

DETAILED DESCRIPTION OF THE PREFERRED EMBODIMENT OF THE INVENTION

Figure 1:
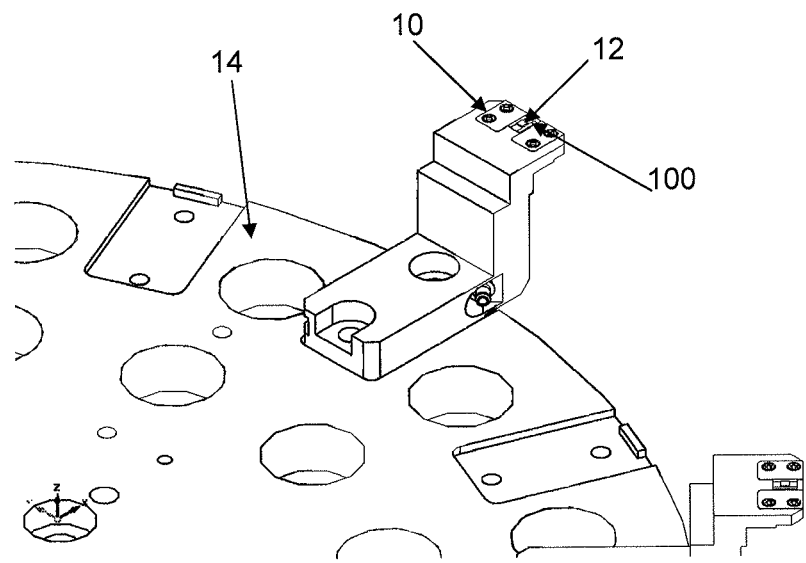
FIG. 1 is an isometric view of a package holder mounted on a turret disc comprised in the semiconductor package testing apparatus according to the preferred embodiment of the invention.

FIG. 1 is an isometric view of a package holder 10 mounted on a turret disc 14 comprised in the semiconductor package testing apparatus according to the preferred embodiment of the invention. The package holder 10 comprises a recess in which a semiconductor package 12 is locatable. The package holder 10 has a force applicator 100 which is operative to produce a first force, such as a vacuum suction force, that is sufficient to hold the semiconductor package 10 in the recess. There is a plurality of package holders 10 mounted on the turret disc 14. In use, the turret disc 14 is rotated to position each package holder 10 and a semiconductor package 12 it is holding at various stations, such as a test contactor station 16, located adjacent to the turret disc 14. Thus, the package holder 10 is positionable together with the semiconductor package 12 at the test contactor station 16.

Figure 2:
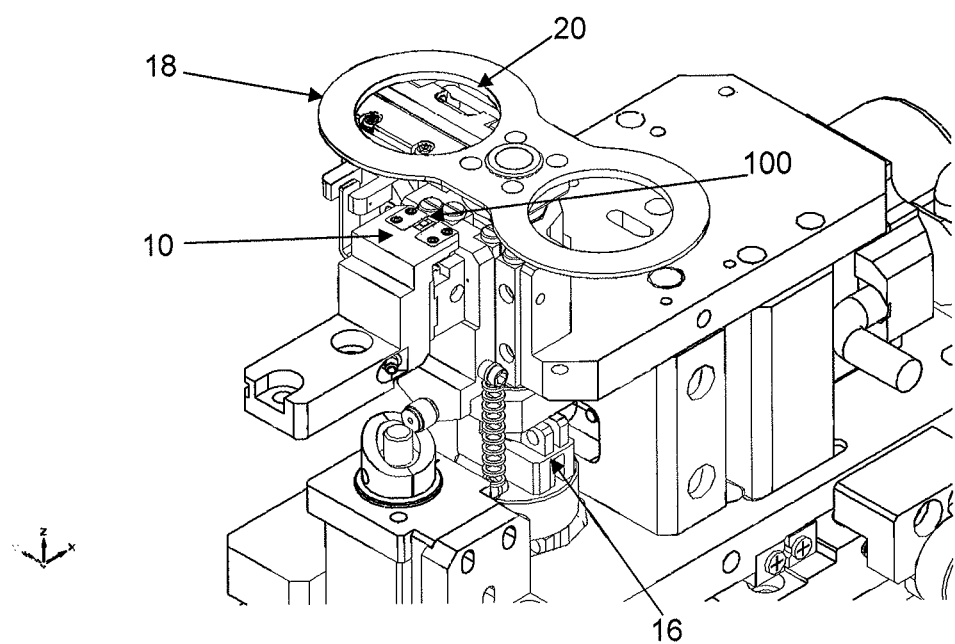
FIG. 2 is an isometric view of the package holder located at a position of a test contactor station.

FIG. 2 is an isometric view of the package holder 10 located at a position of a test contactor station 16 via the rotation of the turret disc 14. Specifically, the test contactor station 16 includes a restraining mechanism, which may be in the form of a rotary cover 18, which is generally rotatable relative to the package holder 10. In a first position, the rotary cover 18 is located away and remote from the package holder 10, whereas in a second position, the rotary cover 18 is located over the package holder 10.

The rotary cover 18 is not limited to any particular shape or design, so long as it is operable to cover a semiconductor package 12 that is held on the package holder 10 to prevent dislodgement of the semiconductor package 12 from the package holder 10 during testing thereof. For this purpose, the rotary cover is configured to restrict lifting of the semiconductor package 12 during testing.

In the illustrated embodiment, the rotary cover 18 has a center portion that comprises a transparent surface, which may be made of glass 20. Alternatively, the transparent surface may be made of quartz or other transparent material. The transparent surface allows light emitted from the semiconductor package 12 during testing to pass through the rotary cover 18 when the rotary cover 18 is in its second position.

Figure 3:
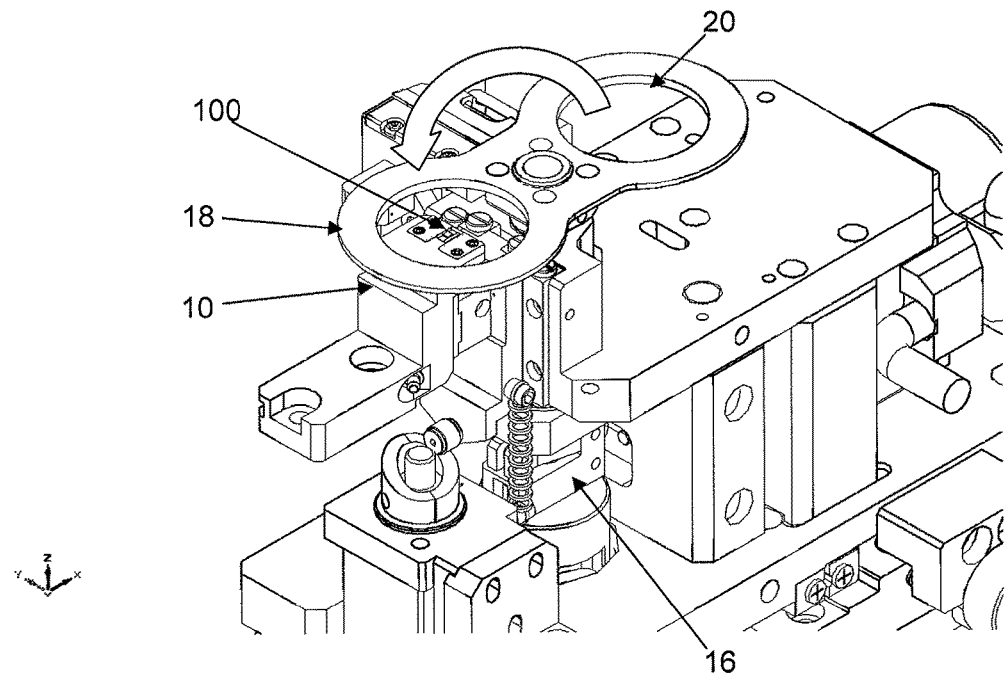
FIG. 3 is an isometric view of a rotary cover of the test contactor station which has been rotated to a position above the package holder.

FIG. 3 is an isometric view of the rotary cover 18 of the test contactor station 16 which has been rotated to a position above the package holder 10. In this position, the rotary cover 18 is operative to cover the semiconductor package 12 to restrict its lifting or vertical motion, as described further below.

Figure 4:
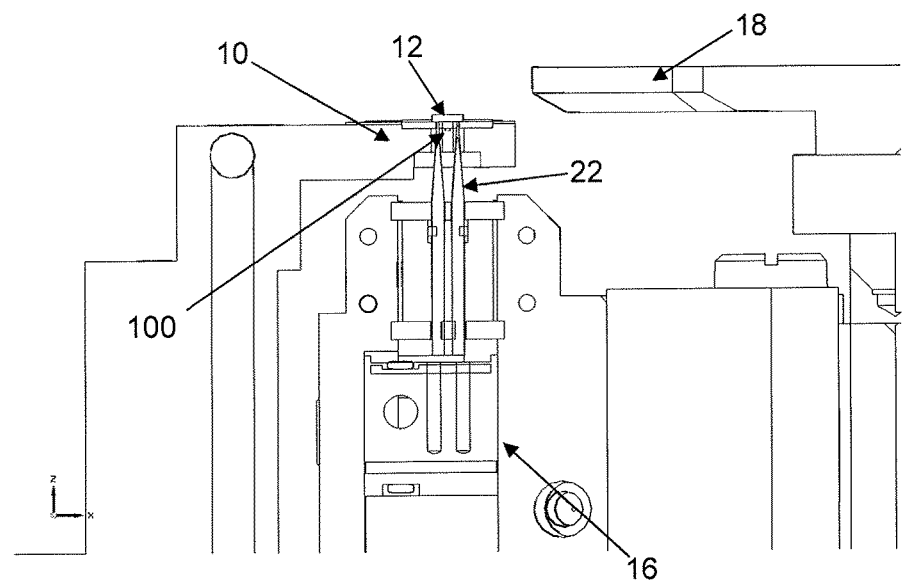
FIG. 4 is a side view of the test contactor station illustrated in FIG. 2 showing probe pins that have moved up to contact a semiconductor package to conduct optical tests.

FIG. 4 is a side view of the test contactor station 16 illustrated in FIG. 2 comprising probe pins 22 located at the test contractor station 16 that have moved up to contact a bottom surface of the semiconductor package 12 for conducting a first set of one or more tests, preferably optical tests. Optical tests are conducted when the probe pins 22 just touch the external leads or contact pads of the semiconductor package 12. At this time, the rotary cover 18 is in its first position remote from the package holder 10. The probe pins 22 are configured using standard contacts (2-point contact) and are operated with a multiplexer with a constant current optical testing. In this case, contact resistance variation does not affect the optical test results as the test is under constant current control by a device tester.

In order to ensure that the probe pins 22 minimally contact the semiconductor package 12 during optical testing, a side vision system (not shown) may further be used to image and compensate for a height variation of the package holder 10. The side vision system is also operative to compensate for height variation of the semiconductor package 12 such that a constant gap is achieved between the mechanical systems and the semiconductor package 12 during the said electrical contact.

Since the contact force exerted from the probe pins 22 on the semiconductor package 12 is not too large, the vacuum suction force from the package holder 10 is sufficient to secure the semiconductor package 12 for conducting optical tests.

However, during a second set of one or more tests including electrical testing, a sufficiently large upwards contact force and Kelvin contact are preferred to be applied on the semiconductor package 12, as the large force can help to pierce through any oxide layer on the external leads or contact pads of the semiconductor package 12 to provide reliable contact. Kelvin contact or 4-point contact during electrical testing is preferred because a key advantage of sensing at four terminals or points is that the separation of respective current and voltage electrodes eliminates the contribution from the impedance in the wiring and contact resistances.

Figure 5:
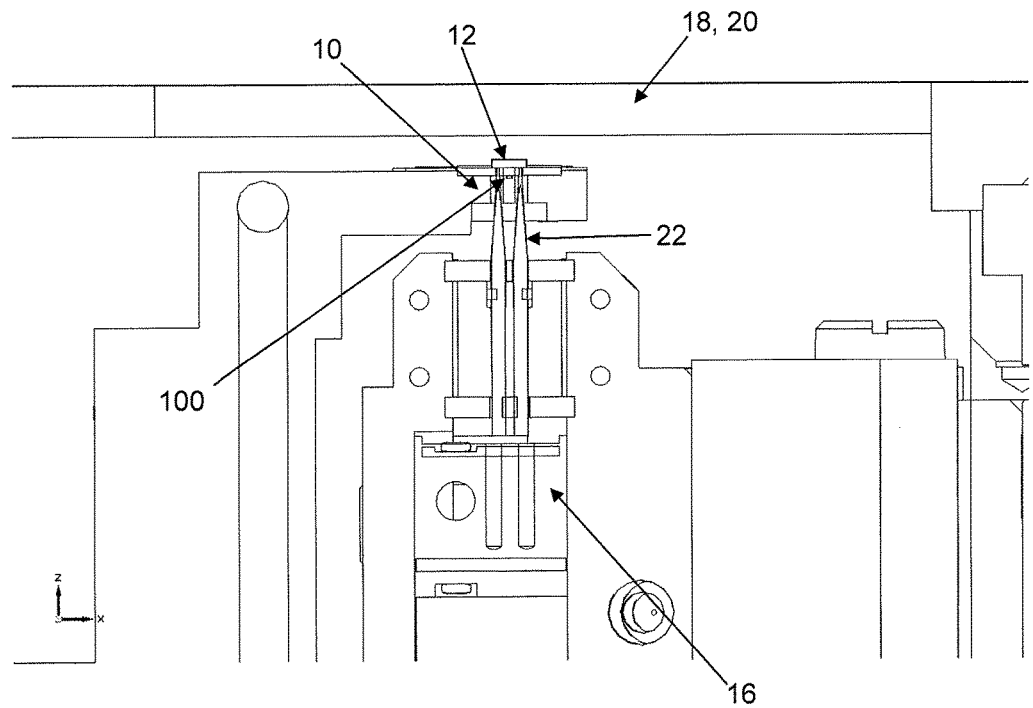
FIG. 5 is a side view of the test contactor station illustrated in FIG. 3 showing the rotary cover having been rotated to a position above the package holder.
Figure 6:
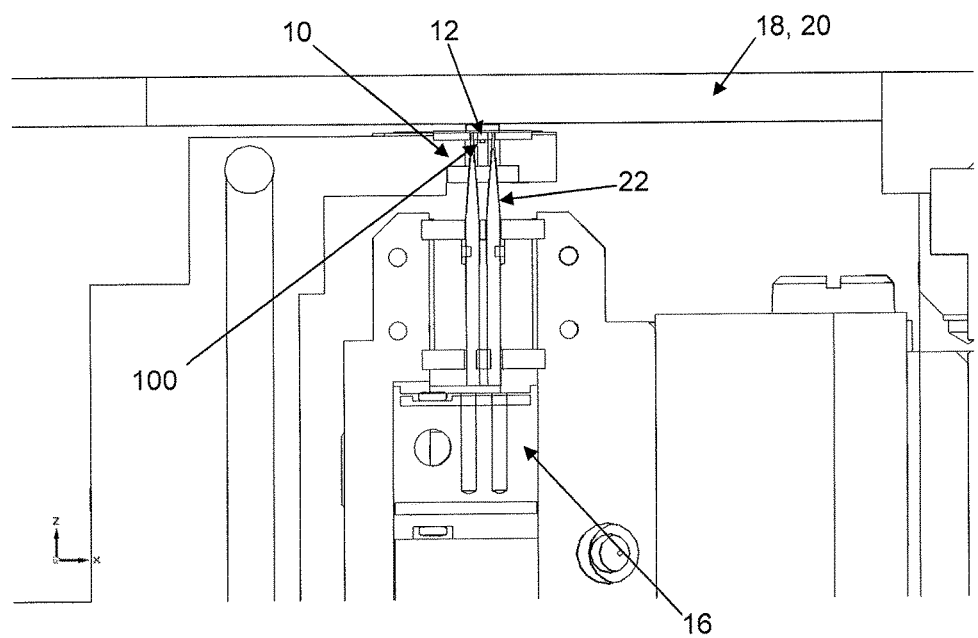
FIG. 6 is a side view of the rotary cover covering the semiconductor package to physically secure the semiconductor package onto the package holder.

FIG. 5 is a side view of the test contactor station 16 illustrated in FIG. 3 showing the rotary cover 18 having been rotated to its second position above the package holder 10. FIG. 6 is a side view of the rotary cover 18 covering the semiconductor package 12 to physically restrict movement (in particular vertical motion) of the semiconductor package 12 with respect to the package holder 10.

With the rotary cover 18 physically restricting the semiconductor package 12 with respect to the package holder 10, it is now possible for the probe pins to move further upwards to exert a greater force onto the semiconductor package 12 to conduct the second set of one or more tests, which includes electrical tests. At the same time, a multiplexer in the device tester will switch to Kelvin contact (4-point contact) to conduct electrical measurements.

Figure 7:
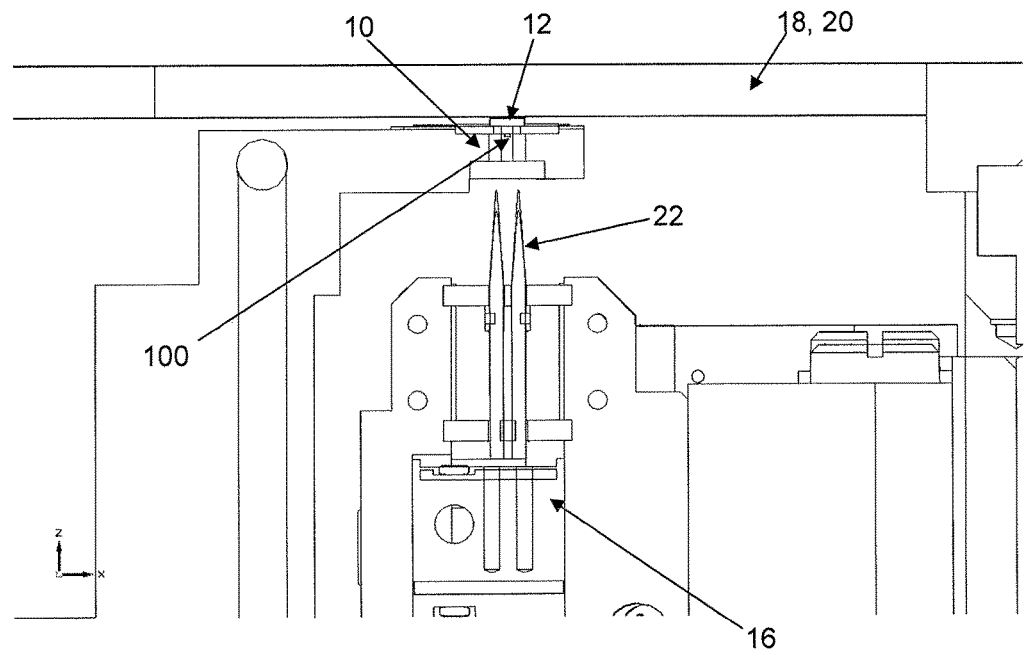
FIG. 7 is a side view of the probe pins having been moved down away from the semiconductor package after testing of the semiconductor package.

FIG. 7 is a side view of the probe pins 22 having been moved down away from the semiconductor package 12 after the electrical tests have been completed. Thereafter, the rotary cover 18 may also move horizontally away from the package holder 10 back to the first position. The turret disc 14 then rotates to move the package holder 10 away from the test contactor station 16 and to transfer it to a downstream station. Simultaneously, the turret disc 14 will transfer another package holder holding another semiconductor package to the test contactor station 16 for testing, and the test cycle starts again.

To avoid any semiconductor packages 12 getting stuck onto the mechanical systems after testing is completed, and after the probe pins 22 are lowered, a "scratch mode" to impart a sliding force on the semiconductor package 12 may be introduced before the semiconductor package 12 held on the package holder 10 is transferred to the downstream station. The rotary cover 18 moves horizontally away from the semiconductor package 12, which is located in the recess of the package holder 10. The recess of the package holder 10 and the horizontal movement of the rotary cover 18 away from the semiconductor package 12, help to slide the semiconductor package 12 by a small amount while holding the semiconductor package 12 on the package holder 10, so as to loosen the semiconductor package 12 on the package holder 10 before the semiconductor package 12 is transferred to a downstream station.

Alternatively, other mechanical systems such as clampers may also be used to restrict the semiconductor package 12 with respect to the package holder 10 from moving.

Figure 8:
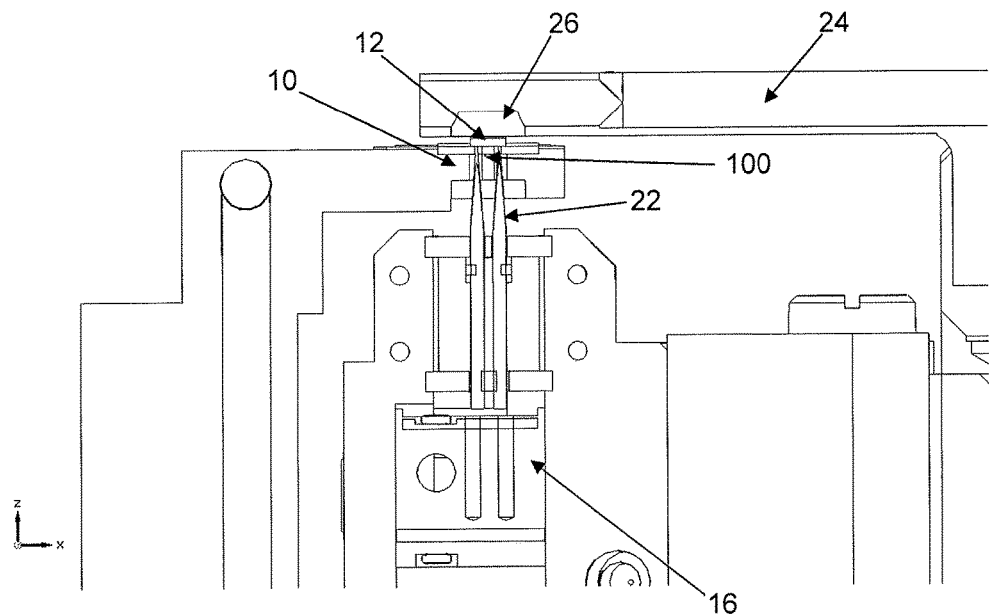
FIG. 8 is a side view of another embodiment of the test contactor station which uses an air cushion to secure the semiconductor package onto the package holder.

FIG. 8 is a side view of another embodiment of the test contactor station 16 which uses an air cushion to secure the semiconductor package onto the package holder. This is different from the first embodiment described above in that no physical contact from a rotary cover 18 or other mechanical system is used to restrict movement of the semiconductor package 12 with respect to the package holder 10. Instead, a rotary swing arm 24 is configured to channel compressed air onto the semiconductor package 12 to restrict movement of the same. A gas outlet 26, which may be formed from a porous material, is formed at an end of the rotary swing arm 24 that is locatable above the package holder 10 and semiconductor package 12, and compressed air is passed through the porous material of the gas outlet 26 onto the semiconductor package 12 without physical contact between the rotary swing arm 24 and the semiconductor package 12.

The air cushion produced from the compressed air will serve to constrain the semiconductor package from moving such that the probe pins 22 can be driven up further to provide a higher probing force on the external leads or contact pads of the semiconductor package 12, the benefits of which have been explained above.

Accordingly, in the preferred embodiments of the invention, the test contactor station 16 is designed to combine both physical contact restriction or pressure non-contact restriction (using an air cushion) on a semiconductor package 12 during electrical tests, as well as vacuum holding of the semiconductor package 12 only during optical tests to preserve measurement integrity.

Figure 9:
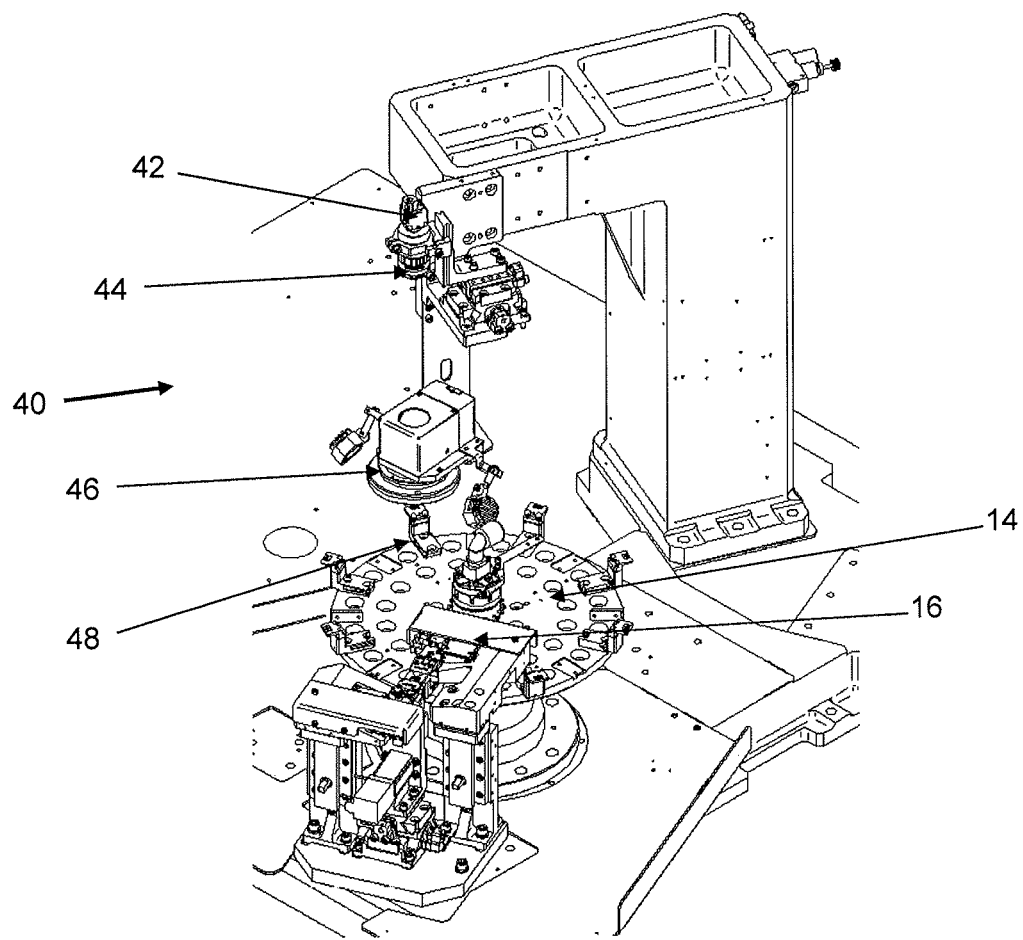
FIG. 9 is an isometric view of an embodiment of a vision system associated with the turret disc 14.

FIG. 9 shows an isometric view of an embodiment of a vision system 40 associated with the turret disc 14. The vision system 40 comprises a camera 42, a lens 44, and a lighting system 46. The vision system 40 is located above an inspection station 48.

The turret disc 14 comprises a plurality of package holders 10, and is rotatable about a vertical axis. Each of the plurality of package holders 10 is positioned at a respective turret position. A respective semiconductor package 12 is located on each of the plurality of package holders 10. For some of the turret positions, there may be a respective station, for example the inspection station 48, located at each of the turret positions.

The vision system 40 is located above the inspection station 48, which is located at a turret position prior to the test contactor station 16. The turret disc 14 rotates about a vertical axis such that the package holder 10 is first positioned at the inspection station 48. The camera 42 obtains an image of the semiconductor package 12, through the lens 44. The lighting system 46 provides a sufficient amount of illumination for the camera 42 to obtain the image of the semiconductor package 12. The vision system 40 inspects the dimensions or determines the position of the semiconductor package 12, from the image obtained by the camera 42. The vision system 40 then feeds back the information of the dimension or the position. After the said inspection, the turret disc 14 rotates about the vertical axis such that the package holder 10 is positioned at a test contactor station 16.

Figure 10:
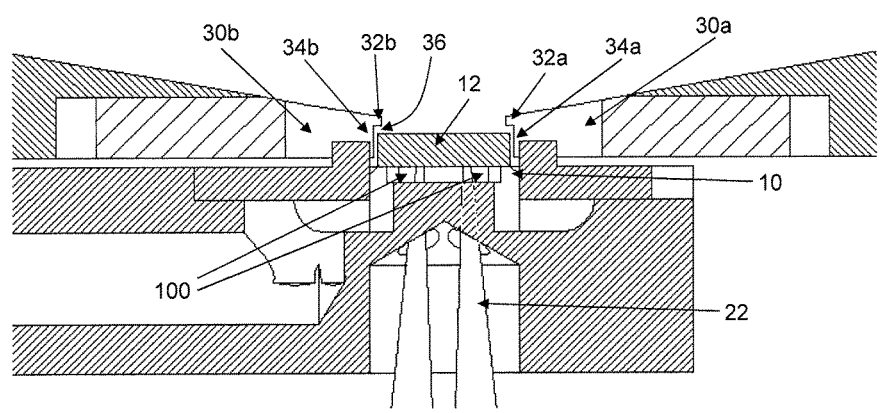
FIG. 10 is a side view of another embodiment of the test contactor station showing clamps positioned close to the semiconductor package.

FIG. 10 shows a side view of another embodiment of the test contactor station 16, where a semiconductor package 12 undergoes a first or initial set of one or more tests, for example an optical test. The turret disc 14 has been rotated further such that the package holder 10 is now positioned at the test contactor station 16.

In this embodiment, the restraining mechanism comprises first and second restrainers 30a, 30b. The first restrainer 30a comprises a first finger 32a and a first shoulder 34a connected to the first finger 32a, and the second restrainer 30b comprises a second finger 32b and a second shoulder 34b connected to the second finger 32b. The fingers 32a, 32b restrict lifting or vertical motion of the semiconductor package 12, whereas the shoulders 34a, 34b restrict or limit lateral motion of the semiconductor package 12. The fingers 32a, 32b are movable in directions away from each other to the first position of the restrainers 30a, 30b, and are movable in directions towards each other to the second position of the restrainers 30a, 30b.

The restrainers 30a, 30b move horizontally to their second position proximate the semiconductor package 12. Information from the vision system 40 is used by a positioning device to position the restrainers 30a, 30b appropriately according to the image obtained of the semiconductor package 12, including dimensions and/or the position of the semiconductor package 12. An advantage of doing so is that the restrainers 30a, 30b are accurately moved to an appropriate position proximate the semiconductor package 12, even when different sizes of semiconductor packages 12 are tested.

The restrainers 30a, 30b may be used to position or align the semiconductor package 12 in an appropriate position on the package holder 10, for example in a recess in the package holder 10. In particular, during positioning or alignment of the semiconductor package 12, the shoulders 34a, 34b may close onto the semiconductor package 12 and push the semiconductor package 12 into the appropriate position on the package holder 10 for testing.

The probe pins 22 move up to touch electrical contacts at a bottom surface of the semiconductor package 12. A vacuum system applies a suction force on the semiconductor package 12 to hold the semiconductor package 12 on the package holder 10. Generally, the smaller the semiconductor package 12, the harder it may be for the vacuum system to hold the semiconductor package 12 on the package holder 10. If the vacuum suction force is insufficient to secure the semiconductor package 12 on the package holder 10, the semiconductor package 12 may lift off and be dislodged from its position on the package holder 10.

Moreover, the light emitted from some LEDs may be affected when the top surfaces of the LEDs are deformed or damaged. If the fingers 32a, 32b directly clamp the top surfaces of the LEDs during optical testing, there is a risk that the top surfaces of the LEDs may become deformed or damaged, and the optical test results would not be accurate or repeatable.

The restrainers 30a, 30b are thus positioned proximate the semiconductor package 12, such that the fingers 32a, 32b are located above a top surface of the semiconductor package 12, and the shoulders 34a, 34b are located laterally adjacent to side surfaces of the semiconductor package 12. The restrainers 30a, 30b are positioned such that there is a top gap 36 between the fingers 32a, 32b and the semiconductor package 12, and a side gap between the shoulders 34a, 34b and the semiconductor package 12.

The restrainers 30a, 30b are positioned such that the top gap 36 between the fingers 32a, 32b and the semiconductor package 12 is sufficient to prevent the semiconductor package 12 from being totally dislodged from its position on the package holder 10. The top gap 36 that is sufficient to prevent the semiconductor package 12 from being totally dislodged from the package holder depends on the dimensions of the semiconductor package 12 and the dimensions of the restrainers 30a, 30b. Generally, the smaller the semiconductor package 12 or the restrainers 30a, 30b, the smaller the top gap 36. The top gap 36 may vary widely, and may generally be in the order of about 0.1 mm. The side gap may vary widely, and may generally be in the order of about 0.01 mm.

The restrainers 30a, 30b may comprise clamps, for example clamps that are at least partially made of a transparent material such as sapphire, especially a portion of the clamps that is above the semiconductor package 12 when the restrainers 30a, 30b are at the second position. The transparency of the restrainers 30a, 30b allow a maximum amount of light emitted from the semiconductor package 12 to pass through the restrainers 30a, 30b without obstruction during testing of the semiconductor package 12.

Figure 11:
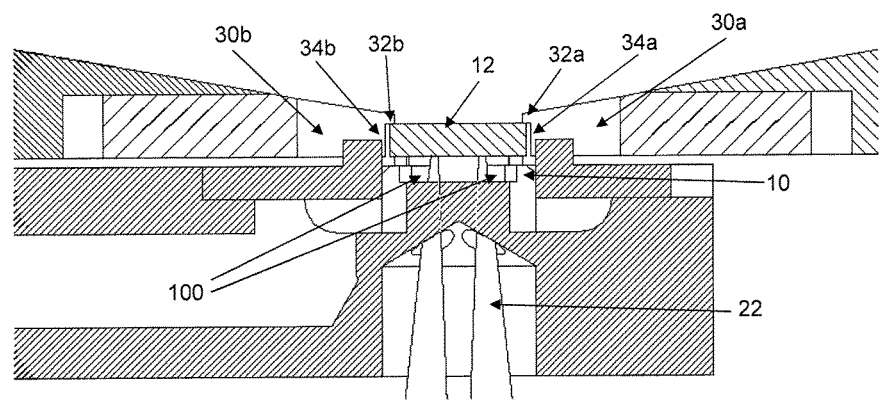
FIG. 11 is a side view of the test contactor station showing the clamps contacting the semiconductor package.

FIG. 11 shows a side view of the test contactor station 16, where the semiconductor package 12 undergoes a second or subsequent set of one or more tests, for example an electrical test. The second set of one or more tests may be conducted after the first set of one or more tests, such as after the optical test.

The probe pins 22 are touching the electrical contacts at the bottom surface of the semiconductor package 12. In order to perform the electrical test, the probe pins 22 typically have to exert a sufficiently large force on the bottom of semiconductor package 12 to allow the electrical test to be performed.

Due to the large force exerted on the bottom of the semiconductor package 12 during the electrical test, the vacuum suction force may be insufficient to secure the semiconductor package 12 on the surface of the package holder 10, and thus the semiconductor package 12 may vertically lift off from the surface of the package holder 10.

Therefore, when the probe pins 22 push onto the bottom of the semiconductor package 12, the probe pins 22 may urge the semiconductor package 12 upwards until the top gap 36 is closed and the top surface of the semiconductor is pushed against the fingers 32a, 32b, thus maintaining the position of the semiconductor package 12 on the package holder 10 or preventing the semiconductor package 12 from being dislodged from the package holder 10, even when the vacuum suction force is insufficient to secure the semiconductor package 12 on the surface of the package holder 10. Comparatively, during the first set of one or more tests, the top gap 36 may be maintained since the semiconductor package 12 is not lifted by the probe pins 22

By providing a small contact force (less than 5 gf) and 2-point contact for optical tests, and a larger contact force (5 gf-20 gf) and 4-point contact for electrical tests, the repeatability and accuracy of optical and electrical measurements can be preserved without compromising the optical measurement results which may be caused by physical parts blocking light emission during optical testing which will jeopardize measurement results. From the measurement data, it has been found that the repeatability of the forward voltage (Vf) during testing can be significantly improved using the apparatus according to the preferred embodiments of the invention.

Although the present invention has been described in considerable detail with reference to certain embodiments, other embodiments are possible.

For example, the restrainers 30a, 30b may be configured to move to a position proximate the semiconductor package 12, without the information from the vision system 40. This can be done, for example, when every semiconductor package 12 is of the same dimensions and they are placed in the same position on the package holder 12.

Although the restrainers 30a, 30b may remain stationary during the first and second sets of tests, the restrainers 30a, 30b may also move away from the semiconductor package 12 at any time during the first and second sets of tests. For example the restrainers 30a, 30b may move horizontally away from the second position after positioning or alignment of the semiconductor package, and only move back to the second position before the second set of one or more tests.

The invention described herein is susceptible to variations, modifications and/or additions other than those specifically described and it is to be understood that the invention includes all such variations, modifications and/or additions which fall within the spirit and scope of the above description.

The invention claimed is:

1. A semiconductor package testing apparatus comprising:
   a package holder configured to hold a semiconductor package, wherein the package holder is configured to move to a test contactor station while holding the semiconductor package;
   probe pins located at the test contactor station, the probe pins configured to move against the semiconductor package for contacting a bottom surface of the semiconductor package to apply an upwards force on the semiconductor package during testing of the semiconductor package; and
   a restraining mechanism configured to move relative to the package holder and the semiconductor package while the semiconductor package is being held by the package holder from a first position remote from the package holder to a second position over the package holder, the restraining mechanism at the second position being configured to restrict lifting of the semiconductor package by the probe pins during testing of the semiconductor package,
   wherein the restraining mechanism is transparent such that light emitted from the semiconductor package is allowed to pass through the restraining mechanism at its second position during testing of the semiconductor package.

2. The semiconductor package testing apparatus as claimed in claim 1, wherein the restraining mechanism comprises restrainers comprising first and second opposing fingers, and the restrainers are movable to the second position whereat a gap is formed between the semiconductor package and the first and second fingers,
   wherein the said gap is configured to be closed when the probe pins lift the semiconductor package during testing thereof.

3. The semiconductor package testing apparatus as claimed in claim 2, wherein the said gap is configured to be maintained during a first set of one or more tests conducted by the probe pins on the semiconductor package when the semiconductor package is not lifted.

4. The semiconductor package testing apparatus as claimed in claim 2, further comprising a first shoulder connected to the first finger and a second shoulder connected to the second finger,
   wherein the first and second shoulders are operative to restrict lateral motion of the semiconductor package on the package holder.

5. The semiconductor package testing apparatus as claimed in claim 4, wherein the first and second shoulders are operative to close onto and push the semiconductor package into a desired position on the package holder for testing.

6. The semiconductor package testing apparatus as claimed in claim 2, wherein the first and second fingers are movable in directions away from each other to the first position of the restrainers, and are movable in directions towards each other to the second position of the restrainers.

7. The semiconductor package testing apparatus as claimed in claim 2, further comprising:

a vision system that is operative to obtain an image of the semiconductor package when the semiconductor package is on the package holder, and a positioning device operative to position the first and second fingers to align the first and second fingers with the semiconductor package based on such image that is obtained.

8. The semiconductor package testing apparatus as claimed in claim 2, wherein at least a portion of the restrainers above the semiconductor package is made of a transparent material at the second position of the restrainers for allowing light emitted from the semiconductor package to pass through the restrainers during testing of the semiconductor package.

9. The semiconductor package testing apparatus as claimed in claim 1, wherein the restraining mechanism comprises a rotary cover that is rotatable relative to the package holder when moving the rotary cover between its first and second positions.

10. The semiconductor package testing apparatus as claimed in claim 9, wherein the rotary cover has a transparent surface such that light emitted from the semiconductor package during testing thereof is allowed to pass through the transparent surface of the rotary cover when the rotary cover is in its second position.

11. The semiconductor package testing apparatus as claimed in claim 1, wherein the restraining mechanism is configured to be in the first position when the probe pins are conducting a first set of tests on the semiconductor package, and the restraining mechanism is configured to be in the second position when the probe pins are conducting a second set of tests on the semiconductor package, at least some of the first set of tests being different from the second set of tests.

12. The semiconductor package testing apparatus as claimed in claim 11, wherein the first set of tests comprises optical tests and the second set of tests comprise electrical tests.

13. The semiconductor package testing apparatus as claimed in claim 1, wherein the restraining mechanism is operative to impart a sliding force on the semiconductor package to loosen the semiconductor package on the package holder before the semiconductor package is transferred to a downstream station.

14. The semiconductor package testing apparatus as claimed in claim 1, wherein the restraining mechanism comprises:

a rotary arm and a gas outlet located on the rotary arm, wherein the gas outlet is configured to channel compressed air onto the semiconductor package in the second position of the rotary arm to restrict movement of the semiconductor package with respect to the package holder.

15. The semiconductor package testing apparatus as claimed in claim 14, wherein the gas outlet comprises a porous material and the compressed air is passable through the porous material onto the semiconductor package.

16. The semiconductor package testing apparatus as claimed in claim 1, further comprising a force applicator provided in the package holder for providing a holding force on the semiconductor package to secure it onto the package holder when the restraining mechanism is at the first position and the probe pins are testing the semiconductor package.

17. The semiconductor package testing apparatus as claimed in claim 16, wherein the force applicator is operative to produce a vacuum suction force to secure the semiconductor package onto the package holder.

18. A method for testing a semiconductor package, the method comprising:

moving a package holder holding the semiconductor package to a test contactor station;

moving a restraining mechanism relative to the package holder and the semiconductor package while the semiconductor package is being held by the package holder from a first position remote from the semiconductor package to a second position over the semiconductor package; and thereafter moving probe pins against the semiconductor package to contact a bottom surface of the semiconductor package with tips of the probe pins located at the test contactor station and applying an upwards force on the semiconductor package with tips of the probe pins during testing of the semiconductor package, wherein the restraining mechanism restricts lifting of the semiconductor package by the probe pins at the second position of the restraining mechanism, wherein the restraining mechanism is transparent such that light emitted from the semiconductor package is allowed to pass through the restraining mechanism at its second position during testing of the semiconductor package.

* * * * *